(12) United States Patent
Murji (10) Patent No.: US 8,417,199 B2
(45) Date of Patent: Apr. 9, 2013

(54) METHOD AND APPARATUS FOR IMPROVING EFFICIENCY IN A POWER SUPPLY MODULATED SYSTEM

(75) Inventor: Rizwan Murji, Chicago, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 447 days.

(21) Appl. No.: 12/842,246

(22) Filed: Jul. 23, 2010

(65) Prior Publication Data

US 2012/0021695 A1 Jan. 26, 2012

(51) Int. Cl.
*H04B 1/04* (2006.01)

(52) U.S. Cl.
USPC ...................................... 455/127.1

(58) Field of Classification Search .............. 455/115.1, 455/126, 127.1, 127.2, 127.3
See application file for complete search history.

(56) References Cited

U.S. PATENT DOCUMENTS

| | | | |
|---|---|---|---|
| 5,111,158 A | 5/1992 | Malec et al. | |
| 5,847,602 A | 12/1998 | Su | |
| 5,854,971 A | 12/1998 | Nagoya et al. | |
| 5,977,831 A | 11/1999 | Davis et al. | |
| 6,006,075 A | 12/1999 | Smith et al. | |
| 6,043,707 A | 3/2000 | Budnik | |
| 6,084,468 A | 7/2000 | Sigmon et al. | |
| 6,138,042 A | 10/2000 | Midya et al. | |
| 6,141,541 A | 10/2000 | Midya et al. | |
| 6,161,024 A | 12/2000 | Komara | |
| 6,215,988 B1 | 4/2001 | Matero | |
| 6,242,975 B1 | 6/2001 | Eidson et al. | |
| 6,256,482 B1 | 7/2001 | Raab | |
| 6,275,103 B1 | 8/2001 | Maniwa | |
| 6,353,359 B1 | 3/2002 | Leizerovich | |
| 6,437,641 B1 | 8/2002 | Bar-David | |
| 6,438,360 B1 | 8/2002 | Alberth, Jr. et al. | |
| 6,529,716 B1 | 3/2003 | Eidson | |
| 6,531,917 B2 | 3/2003 | Yamamoto et al. | |
| 6,580,901 B1 | 6/2003 | Mochizuki | |
| 6,606,483 B1 | 8/2003 | Baker et al. | |
| 6,839,549 B2 * | 1/2005 | Pehlke et al. | 455/127.1 |
| 7,164,893 B2 | 1/2007 | Leizerovich et al. | |
| 7,443,244 B2 | 10/2008 | Hagen | |
| 7,454,179 B1 * | 11/2008 | Lee | 455/127.1 |
| 7,457,595 B2 * | 11/2008 | Schoofs et al. | 455/127.1 |
| 7,483,681 B2 * | 1/2009 | Grillo et al. | 455/127.1 |
| 7,551,688 B2 | 6/2009 | Matero et al. | |

(Continued)

OTHER PUBLICATIONS

Non Final Office Action mailed on Jul. 2, 2012 in U.S. Appl. No. 12/842,223, Rizwan Murji, filed Jul. 23, 2010.

*Primary Examiner* — Blane J Jackson
(74) *Attorney, Agent, or Firm* — Anthony P. Curtis; Daniel R. Bestor (57) ABSTRACT

A radio is presented that has a processor, memory, modulator and a power amplifier. An envelope of a signal to be transmitted is used by the processor to control modulation of the voltage of the power amplifier by the modulator between a desired minimum voltage and a desired maximum voltage. Using the memory, the desired minimum voltage is determined from the desired maximum voltage and these voltages are less than nominal minimum and maximum voltage, respectively. The desired minimum voltage is tailored for the radio and takes into account environmental conditions to optimize operating conditions for the radio. If the range of voltages would exceed the dynamic range of the radio, the modulation provided by the modulator is controlled by the processor in steps until the desired minimum and maximum voltages are achieved.

20 Claims, 7 Drawing Sheets

U.S. PATENT DOCUMENTS

| | | |
|---|---|---|
| 7,715,811 B2 * | 5/2010 | Kenington ................ 455/127.1 |
| 8,014,738 B2 | 9/2011 | Camuffo et al. |
| 8,160,517 B2 | 4/2012 | Chan et al. |
| 8,224,399 B2 * | 7/2012 | Lee et al. ...................... 455/572 |
| 2004/0127173 A1 | 7/2004 | Leizerovich |
| 2006/0128324 A1 | 6/2006 | Tan et al. |
| 2006/0199553 A1 * | 9/2006 | Kenington ................ 455/127.1 |
| 2007/0178856 A1 | 8/2007 | Mitzlaff et al. |
| 2010/0112967 A1 * | 5/2010 | Sorensen ................... 455/127.2 |

* cited by examiner

METHOD AND APPARATUS FOR IMPROVING EFFICIENCY IN A POWER SUPPLY MODULATED SYSTEM

TECHNICAL FIELD

The present application relates to a power amplifier and in particular to a power amplifier whose minimum and maximum power supply is modulated.

BACKGROUND

With the ever-increasing demand for portable communication devices, reliability and efficiency of both user devices and devices in the supporting network has become of increasing importance. There are a number of different considerations, related to both individual elements as well as system elements, which affect these characteristics. For example, it is desirable to increase both bandwidth efficiency and power efficiency of a power amplifier in various communication devices. While bandwidth efficiency (the rate that data can be transmitted over a given bandwidth) is typically achieved using linear modulation, amplifier efficiency is a significant concern for achieving longer battery life and lower energy costs in transmitters as it usually dominates the power consumption in the system.

A transmitter of the portable communication device or of a communication device in the infrastructure (such as a base station) generally uses a radio frequency power amplifier (RFPA) as the final amplifying stage of a transmitter. The RFPA typically has a fixed power supply voltage. With a fixed supply voltage, however, the efficiency of the RFPA decreases as the output signal magnitude drops, leading to ineffectiveness and excessive peak power capability. To improve efficiency, it is desirable for the RFPA to continually operate near saturation, where the amplifier is close to or slightly gain compressed (about 0.5 dB below gain compression to 0.5 dB in gain compression). This can be achieved by modulating the power supply of the RFPA using the known technique of envelope tracking (i.e. the supply voltage of the RFPA tracks the output signal of the RFPA), which adjusts the power supply of the RFPA such that the power supply voltage of the RFPA follows the output signal thereby allowing the RFPA to continually operate near saturation.

While it is usually desirable in using power supply modulation for the RFPA to continually operate near saturation, a margin is provided to prevent "starvation" of the RFPA. The addition of margin to the power supply voltage is less than ideal because, it reduces average efficiency. Nevertheless, without providing some amount of margin, distortion in the amplified signal is often caused because of unexpected gain compression. Moreover, it is desirable for the RFPA to be adaptable to different forms of modulation, and thus the method of improving the efficiency of the RFPA to be able to operate for any given modulation. It is also desirable to be able to control the minimum voltage of the modulated supply, which improves efficiency especially when operating at low output power.

Therefore, a need exists for improved control of modulation of a power supply voltage to a power amplifier in order for the power amplifier to maintain high efficiency while operating linearly over a wide dynamic range. This control should also allow the power supply modulator implementation to be tolerant of design and component variations and to be backward compatible, thereby interfering minimally with core software used to implement a majority of the transmission functionality.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of the embodiments of shown.

The apparatus and method components have been represented where appropriate by conventional symbols in the drawings, showing only those specific details that are pertinent to understanding the embodiments shown so as not to obscure the disclosure with details that will be readily apparent to those of ordinary skill in the art having the benefit of the description herein. Other elements, such as those known to one of skill in the art, may thus be present.

DETAILED DESCRIPTION

Before describing in detail the various embodiments, it should be observed that such embodiments reside primarily in an apparatus and method related to a power amplifier module in which control of the minimum level of the power amplifier power supply voltage is effected. A processor determines a desired minimum power supply voltage to the power amplifier based on the desired maximum power supply voltage to the power amplifier. The minimum-to-maximum power supply voltages are predetermined and stored internally in the radio for later retrieval. The minimum power supply voltage is adjusted to its desired level for various operating conditions, while the desired maximum output level is maintained.

Figure 1:
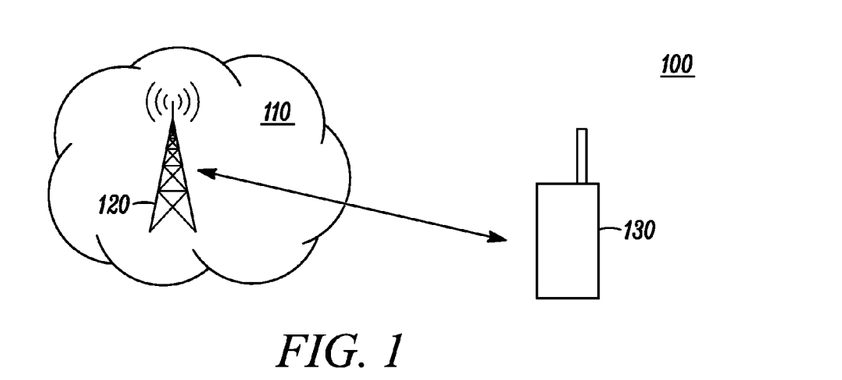
FIG. 1 illustrates an embodiment of a communication system.

FIG. 1 illustrates a general network 100 that includes an infrastructure 110. There are many distributed elements in the infrastructure 110, some local to each other others disposed geographically distant from each other. Such elements include a base station 120, which provides connectivity for a portable communication device 130 disposed within the coverage area serviced by the base station 120 to other devices either in the same coverage area or in a different coverage area through the infrastructure 110. The portable communication device 130 can be, for example, a cellular telephone, personal digital assistant, or a communication device used by emergency personnel.

Figure 2:
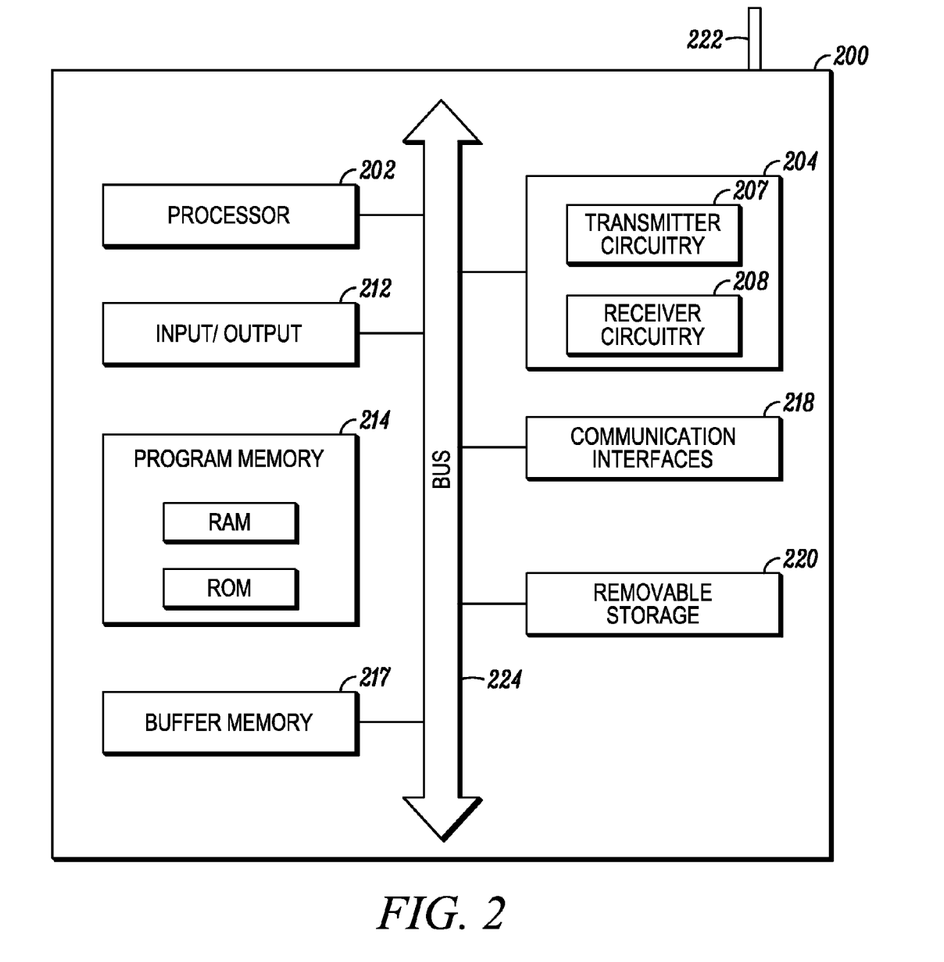
FIG. 2 illustrates an internal block diagram of an embodiment of a communication device.

An embodiment of one such communication device, such as the base station 120, is shown in the block diagram of FIG. 2. The base station 200 may contain, among other components, a processor 202, a transceiver 204 including transmitter circuitry 206 and receiver circuitry 208, an antenna 222, I/O devices 212, a program memory 214, a buffer memory 216, one or more communication interfaces 218, and removable storage 220. The base station 200 is preferably an integrated unit and may contain at least all the elements depicted in FIG. 2 as well as any other element necessary for the base station 200 to perform its electronic functions. The electronic elements are connected by a bus 224.

The processor 202 includes one or more microprocessors, microcontrollers, DSPs, state machines, logic circuitry, or any other device or devices that process information based on operational or programming instructions. Such operational or programming instructions are stored in the program memory 214 and may include instructions such as estimation and correction of a received signal, encryption/decryption, and decisions about whether an alarm exists that are executed by the processor 202 as well as information related to the transmit signal such as modulation, transmission frequency or signal amplitude. The program memory 214 may be an IC memory chip containing any form of random access memory (RAM) and/or read only memory (ROM), a floppy disk, a compact disk (CD) ROM, a hard disk drive, a digital video disk (DVD), a flash memory card or any other medium for storing digital information. One of ordinary skill in the art will recognize that when the processor 202 has one or more of its functions performed by a state machine or logic circuitry, the memory 214 containing the corresponding operational instructions may be embedded within the state machine or logic circuitry. The operations performed by the processor 202 and the rest of the base station 200 are described in detail below.

The transmitter circuitry 206 and the receiver circuitry 208 enable the base station 200 to respectively transmit and receive communication signals. In this regard, the transmitter circuitry 206 and the receiver circuitry 208 include appropriate circuitry to enable wireless transmissions. The implementations of the transmitter circuitry 206 and the receiver circuitry 208 depend on the implementation of the base station 200 and the devices with which it is to communicate. For example, the transmitter and receiver circuitry 206, 208 may be implemented as part of the communication device hardware and software architecture in accordance with known techniques. One of ordinary skill in the art will recognize that most, if not all, of the functions of the transmitter or receiver circuitry 206, 208 may be implemented in a processor, such as the processor 202. However, the processor 202, the transmitter circuitry 206, and the receiver circuitry 208 have been artificially partitioned herein to facilitate a better understanding. The buffer memory 216 may be any form of volatile memory, such as RAM, and is used for temporarily storing received or transmit information.

The base station 200 may also contain a variety of I/O devices such as a keyboard with alpha-numeric keys, a display (e.g., LED, OELD) that displays information about the base station or communications connected to the base station, soft and/or hard keys, touch screen, jog wheel, a microphone, and a speaker. Again, although the device discussed with relation to the figures is specifically referred to the base station, other communication devices that employ a power amplifier may be used.

Figure 3:
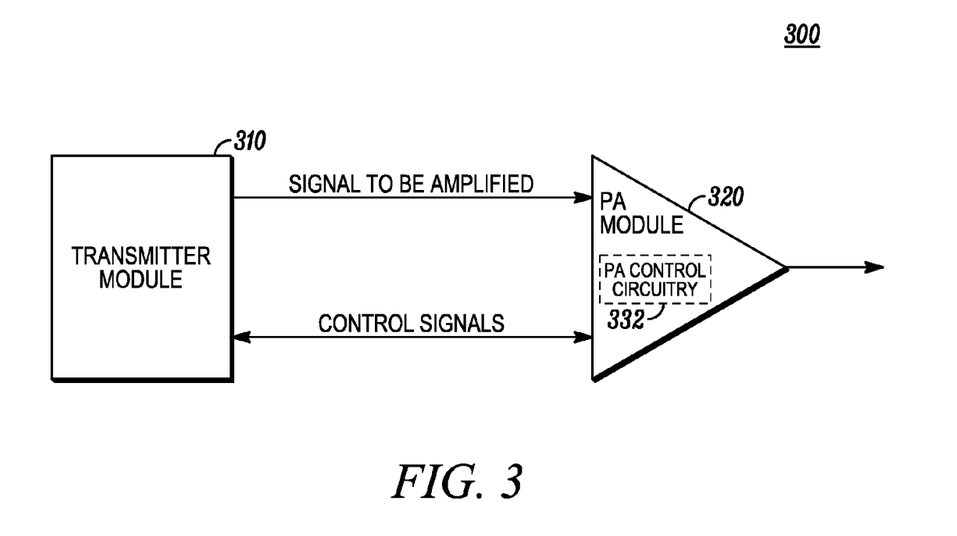
FIG. 3 illustrates a block diagram of an embodiment of the communication device of FIG. 2.

As shown in the simplified block diagram of FIG. 3, the transmitter portion of the base station 300 contains a transmitter module 310 and a power amplifier (PA) module 320. The transmitter module 310 supplies signals to be power amplified (the final stage of amplification) to the PA module 320. The PA module 320 also contains PA control circuitry 322. The PA control circuitry 322 enables the transmitter module 310 and PA module 320 to exchange control signals including, if desired, alarm conditions from the PA module 320 to the transmitter module 310, and alert instructions and envelope modulation signals from the transmitter module 310 to the PA module 320.

Figure 4:
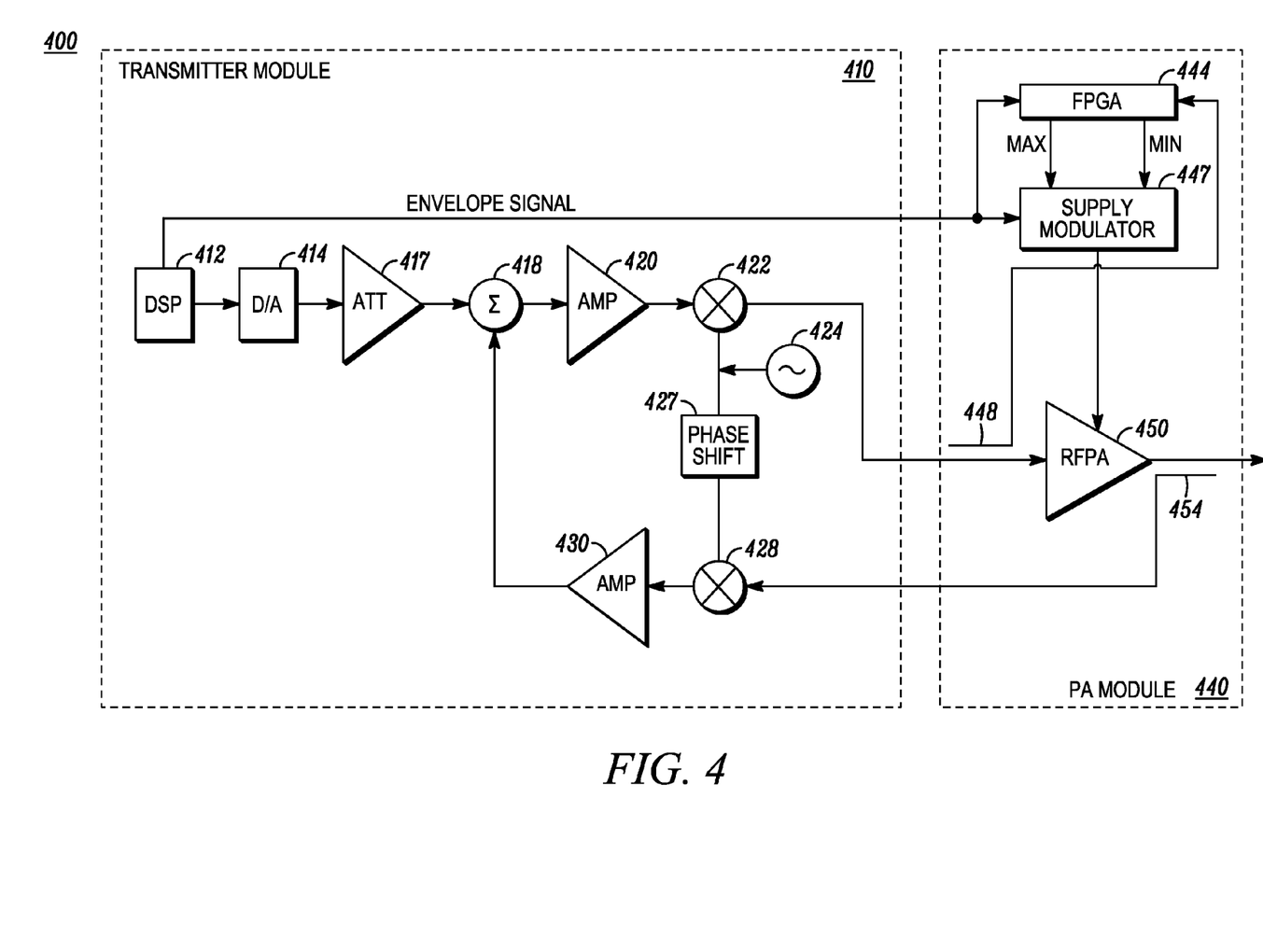
FIG. 4 illustrates a block diagram of an embodiment of the communication device of FIG. 3.

The transmitter module and PA module are shown in more detail in the transceiver 400 of FIG. 4. The transceiver 400 can employ any of a number of linear modulation techniques, such as Integrated Digital Enhanced Network (iDen), Terrestrial Trunked Radio (TETRA) and Transducer Electronic Data Sheet (TEDS) platforms. In each of the embodiments, the input RF signal is assumed to be a modulated signal. However, the input signal may also comprise of a multi-carrier signal or a slotted signal. The slotted signal can comprise at least one off slot or a lower power slot in addition to the slots carrying modulated data.

The transceiver 400 contains a transmitter module 410 and PA module 440. The transmitter module 410 has a digital signal processor (DSP) or other microprocessor 412. The DSP 412 includes a program for implementing power supply modulation. The DSP 412 provides a digital signal to be transmitted, which is then converted to an analog signal by a digital-to-analog (D/A) converter 414. Although the DSP 412 may generate in-phase (I) and quadrature-phase (Q) baseband signals, as well known in the art, only one such signal is shown in FIG. 4 for convenience. Although a transmitter configuration using Cartesian feedback is shown, other implementations such as polar feedback, pre-distortion, or feed-forward implementations may be used.

The I and Q signals from the DSP 412 are attenuated by an attenuator 416, which may be passive or active. The attenuated signals are supplied to a summer 418, which sums the attenuated signals with baseband signals from a feedback loop. The summed signals are amplified by an amplifier 420 and then upconverted to transmission frequency by a modulator 422, which creates a low power RF signal according to a modulation scheme. The summed signals may be upconverted directly, as shown, or through an intermediate frequency. The modulator 422 is supplied with a carrier signal from an oscillator 424. As above, as only one signal is shown, the 90° phase shifter used to provide signals to modulate the Q signal is not shown.

The low level RF signal from the modulator 422 is provided to an RFPA 450 in the PA module 440. Other amplification and/or attenuation stages in the transmitter module 410 and/or PA module 440 have been omitted in FIG. 4 for clarity.

The RFPA 450 in the PA module 440 provides power amplification of the low level RF signal for transmission. A coupler 454 couples the output from the RFPA 450, which is then fed back to the transmitter module 410. The analog signal from the coupler 454 is supplied to a demodulator 428, where it is demodulated from the transmission frequency to baseband. The signal from the coupler 454 may be amplified and/or attenuated prior to being demodulated. One or more phase shifters 426 provide a predetermined phase shift of the carrier signal from the oscillator 424. This phase shift is used to compensate the I and Q signals for the individual path delays in the Cartesian feedback loop as well as the overall loop delay. The baseband signal is then amplified by a feedback amplifier 430 before being supplied to the summer 418, where it is used to linearize the signal to be transmitted.

The PA module 440 also contains a processor such as a floating-point gate array (FPGA), DSP, or complex programmable logic device (CPLD) 444 (hereinafter referred to as an FPGA for convenience), a power supply modulator 446, and an input coupler 448. The DSP 412 in the transmitter module 410 supplies envelope information to the FPGA 444 and the power supply modulator 446. Specifically, the DSP 412 provides a modulated envelope signal with known minimum and maximum levels of the signal to be transmitted. The various digital signals from the DSP 412 are converted to analog signals either in the PA module 440 or in the Transmitter module 410. Although the input coupler 448 is shown as coupling the signal supplied to the RFPA 450, it can be placed anywhere along the forward path of the feedback loop (i.e., after the output of the summer 418).

The power supply modulator 446, which may be a fast acting DC to DC converter, modulates the power supply voltage of the RFPA 450 such that the modulated power supply voltage corresponds to the desired power supply voltage determined using the envelope signal of the signal to be transmitted by the RFPA 450. Such converters are known in the art, and provide an output corresponding to a reference signal, which as shown in FIG. 4 is the analog envelope signal provided by the DSP 412. Alternatively, a digital signal corresponding to the analog envelope signal may be supplied to the power supply modulator 446 by the DSP 412.

To control the power supply voltage, the FPGA 444 receives the envelope signal from the DSP 412 and the envelope signal from the input coupler 448 to determine the current power supply voltage modulation setting of the power supply modulator 446 and select the appropriate power supply voltage to ensure that compression does not occur within the RFPA 450. Once this power supply voltage is selected, the FPGA 444 controls the power supply modulator 446 to limit the power supply voltage using multiple control signals sent to the power supply modulator 446. The coupled signal from input coupler 448 is an RF signal that is fed to, for example, an envelope detector (not shown). The envelope detector produces a detected envelope of the input signal is fed to the FPGA 444. In another embodiment, rather than the DSP 412 providing the envelope of the signal to be transmitted, another envelope detector may receive the signal to be transmitted from the DSP 412 (in addition to the D/A converter 414) and provide the envelope to the FPGA 444. Such envelope detectors are known in the art and thus will not be described in further detail herein.

In the embodiment shown in FIG. 4 the transmitter module 410 and the PA module 440 are able to operate essentially independent of each other. This is to say that independent of whether or how the PA Module 440 is altering the power supply voltage, the transmitter module 410 receives the same signals from and sends the same signals to the PA module 440. Thus, if adjustment of the power supply modulation level is not desired, the PA module 440 can be replaced by another PA module that does not contain the FPGA 444 (as well as other supporting circuitry)—i.e., one that does not require software changes in the DSP when operating in PSM mode— or contains a circuit that disengages the FPGA 444 from the power supply modulator 446. This allows the transceiver 400 to be backwards compatible. As is apparent from the implementation shown in FIG. 4, the apparatus and method used to adjust the minimum power supply voltage only relies on information that is available within the PA module 440.

As shown in FIG. 4, two control signals are provided from the FPGA 444 to the power supply modulator 446: a minimum voltage control signal and a maximum voltage control signal. The minimum-to-maximum power supply voltage relationship of the RFPA 450 is predetermined, during factory calibration or bench testing, where the minimum power supply voltage is based on stability of the RFPA 450. In general, while the minimum power supply voltage is about ½ the maximum power supply voltage, this varies in a nonlinear manner as the minimum power supply voltage is reduced such that, for example, as the maximum power supply voltage reaches single digit voltages, the minimum power supply voltage approaches zero volts. The results ($V_{min}=f(V_{max})$) are stored in the FPGA 444 as a lookup table or as polynomial with corresponding coefficients. The FPGA 444 thus determines the minimum power supply voltage to provide to the RFPA 450 based on the maximum power supply voltage to the RFPA 450. As the minimum power supply voltage to the RFPA 450 decreases, so does the maximum power supply voltage to the RFPA 450. Thus, if the minimum voltage supply were adjusted independent of the maximum supply voltage, the RFPA 450 will begin to gain compress, become unstable, or fail device specifications or FCC regulations (e.g., adjacent channel power restrictions). In this case, as described in more detail below (with relation to FIG. 7), the maximum and minimum power supply voltages are adjusted in steps.

In general, the minimum power supply voltage is limited due to rapidly changing gain and phase, resulting in high amplitude and phase distortion to the amplified RF modulated signal at low power supply voltages. One solution would be to determine the minimum power supply voltage based only on the transmitted output power and then store this relationship in memory. Such a solution, however, does not take into account circuit, part-to-part, and operating temperatures of the implementation and instead limits the minimum power supply voltage to the worst case minimum power supply voltage. By relating the minimum power supply voltage to the maximum power supply voltage (which is optimal independent of output power and other variations, such as part-to part variations and temperature), a more optimal power amplifier efficiency can be achieved.

Consider, for example, the effects of ambient temperature on the minimum and maximum power supply voltages. The linearity of power amplifiers worsens with increasing temperature. Thus, a higher maximum power supply voltage is used to maintain linearity and output power requirements at a temperature extreme of 60° C. than at a temperature extreme of −30° C. If the minimum power supply voltage were to be based solely on the transmitted output power, the same minimum power supply voltage (based on the highest temperature level for which the power amplifier is to be employed) would be used at −30° C. as at 60° C. However, when the minimum power supply voltage is based on maintaining an allowable gain/phase change, the minimum power supply voltage is reduced at −30° C. since a lower maximum power supply voltage is employed, thereby improving efficiency.

Figure 5:
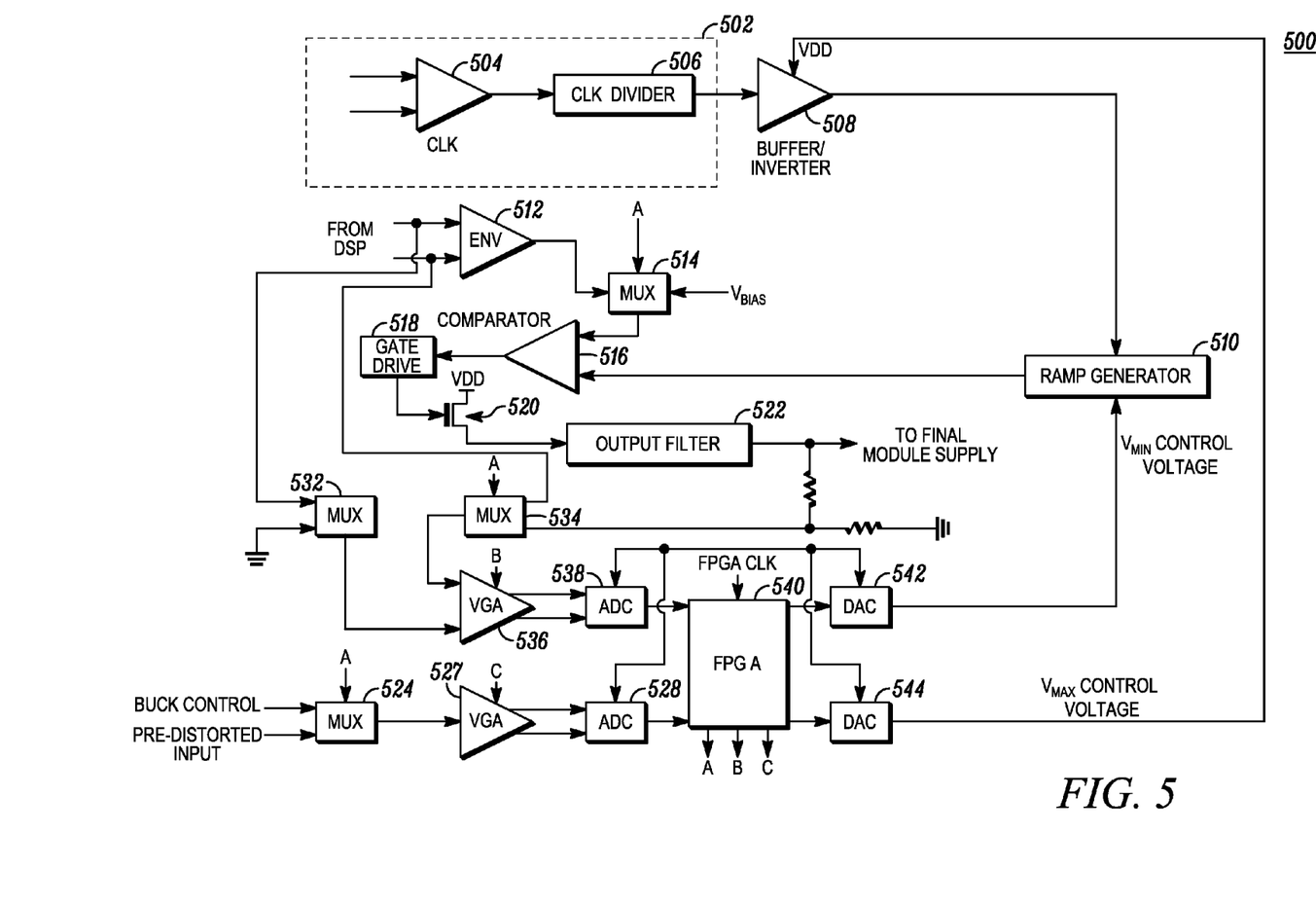
FIG. 5 illustrates a block diagram of an embodiment of architecture in the PA module of FIG. 4.

One embodiment of the components associated with the FPGA 444 and the power supply modulator 446 of FIG. 4 is shown in the architecture 500 of FIG. 5. Some or all of the components pictured may be present in the PA module shown in FIG. 4, but are not shown in FIG. 4 for clarity. The signals from the Transmitter Module are differential signals, which are converted to single end signals in the architecture 500. However, in other embodiments differential signals may be maintained throughout the architecture 500 or single end signals may be supplied by the Transmitter Module and retained throughout the architecture 500.

In the embodiment shown, clock (CLK) and envelope (ENV) signals are provided from the Transmitter Module. The clock module 502 contains a CLK differential-to-single ended amplifier 504 (whose output is a square wave and whose gain may be variable) and a CLK divider 506 that reduces the clock rate of the clock signals from the CLK differential-to-single ended amplifier 504. Although the CLK signal is shown in FIG. 5 as being provided by the Transmitter Module, the CLK signal may instead originate in the PA Module using one or more oscillators and associated circuitry therein. The CLK signal may be single-ended or a single-ended clock converted to a differential clock. The signal from the CLK module is a square wave having a predetermined voltage range, for example 0 to 5V. The CLK signal is supplied to a Buffer (that may or may not invert the signal) 508, which adjusts the voltage range of the signal using a maximum voltage control signal. The maximum voltage control signal is used as the power supply voltage VDD of the Buffer 508 so that the output signal from the Buffer 508 is a square wave that has a voltage range of 0 to VDD. The output signal of the Buffer 508 is supplied to one input of a ramp generator 510. The gain may also be adjusted using a variable gain amplifier in the CLK path to the ramp generator 510.

The ENV signal from the Transmitter Module is also shown in FIG. 5 as being converted at an ENV differential-to-single ended converter 512 from a differential-to-single ended signal. The ENV differential-to-single ended converter 512 may also amplify or attenuate signals passing through it and will be referred to hereafter as ENV converter. The signal from the ENV converter 512 is supplied to an analog multiplexer (MUX) 514 along with a preset (in this embodiment constant) voltage Vbias. A control signal A is used to select either the ENV signal or the preset voltage. The signal selected from the multiplexer 514 as well as with the signal from the ramp generator 510 are supplied to a comparator 516. The output from the comparator 516 is amplified by a gate driver circuit 518 and then switched through a transistor 520 (shown as a MOSFET, although other transistors such as a BJT may be used) or other gate circuit. The output from the transistor 520 is then filtered by an output filter 522 before being provided to the power supply of the RFPA 450 shown in FIG. 4.

The differential ENV signal is also supplied to separate multiplexers 532, 534, each of which are controlled by the same control signal A as multiplexer 514. The other selectable input of one of the multiplexers 532 is grounded while the other input selectable input of the other of the multiplexers 534 is tied to the output of the output filter 522 through a voltage divider circuit (as shown formed by a pair of resistors). The outputs of the multiplexers 532, 534 are supplied to a variable gain amplifier (VGA) 536, whose analog differential output is supplied to an ADC 538 that produces a single ended digital output. In other embodiments, similar to the CLK signal, the ENV signal can be a single-ended only signal or a single ended signal converted to a differential signal. In these embodiments, the VGA 536 would be a single-ended input multiplexer or a single ended to differential multiplexer and multiplexer 532 would be eliminated.

Another multiplexer 524, controlled by the same control signal as multiplexers 514, 532 and 534, selects between a buck control signal (fixed DC voltage) and the pre-distorted signal from the input coupler 448 in FIG. 4. Similar to the above, the output from multiplexer 524 is supplied to another VGA 526, whose analog differential output is supplied to an ADC 528 that produces a single ended digital output. The gains of the VGAs 526, 536 are individually controlled by different control signals B, C, which permits full usage of the output range of the ADCs 528, 538. The outputs of the ADCs 528, 538 are supplied to the FPGA 540, which employs the algorithm described herein to determine the minimum and maximum power supply voltages. The FPGA 540 also provides the control signals A, B, C to the multiplexers 514, 524, 532, 534 and VGAs 526, 536. The digital minimum and maximum power supply voltages from the FPGA 540 are supplied to DACs 542, 544. The analog output from DAC 542, which indicates the minimum power supply voltage, is supplied to the other input of the ramp generator 510 (e.g., the positive input of an op amp used in the ramp generator 510). Similarly, the output from DAC 544, which indicates the maximum power supply voltage, is supplied as the VDD signal to the Buffer 408. The ADCs 528, 538, FPGA 540, and DACs 542, 544 are all clocked at the same rate. In FIG. 5, the FGPA clock is shown, which can be derived off of the clock module 502 or can be a new derived clock that may be the same or different.

The use of the multiplexers 514, 524, 532, 534 permits the PA module to switch between envelope mode and buck emulation mode, the latter of which enables the PA module to be backwards compatible with older device architectures. In one embodiment, in the buck emulation mode the control signal A of the FPGA 540 is set to 1, thereby instructing the power supply modulator in FIG. 4 to provide a constant power supply voltage to the RFPA. Control signals B and C are used for gain control and are set accordingly. In the buck emulation mode, either of the inputs to the ramp generator may stay fixed while the other input varies (i.e., Vbias supplied to multiplexer 514 or the control signals from the DACs 542, 544) to ensure that the optimal amount of compression is maintained. Thus, in the buck emulation mode either the power supply voltage of the RFPA is not modulated (i.e., pass-thru at the system voltage supply) or is modulated independent of the envelope signal with a constant voltage that is a function of output power.

In the envelope mode, the control signal A of the FPGA 540, which is provided to the multiplexers 514, 524, 532, 534, is set to 0, allowing for the maximum and minimum power supply voltage of the modulated signal to be set to the desired levels. Similarly, control signals B and C control the gain of VGAs 526, 536. The FPGA 540 sets the control voltages to reduce the minimum power supply voltage and to maintain the maximum power supply voltage at the desired level. As the minimum control voltage signal (Vmin_control signal) increases, the minimum power supply voltage decreases. As Vmin_control signal decreases, the minimum power supply voltage increases. In one embodiment, Vmin_control signal is a signal to a positive input of an op amp (not shown) in the ramp generator 510, thereby adjusting the offset of the ramp signal generated by the ramp generator 510. The maximum control voltage signal (Vmax_control signal) adjusts the magnitude of the CLK signal being provided to the ramp generator 510.

In one embodiment, Vmax_control signal may be varied over a predetermined range, e.g., from 2.8V to 5.5V. As Vmax_control signal decreases, the maximum power supply voltage increases. As Vmax_control signal increases, the maximum power supply voltage decreases. The ramp generator 510 generates a triangular waveform biased at a predetermined value, e.g., 1.8V (at the positive input of the op amp).

Figure 6:
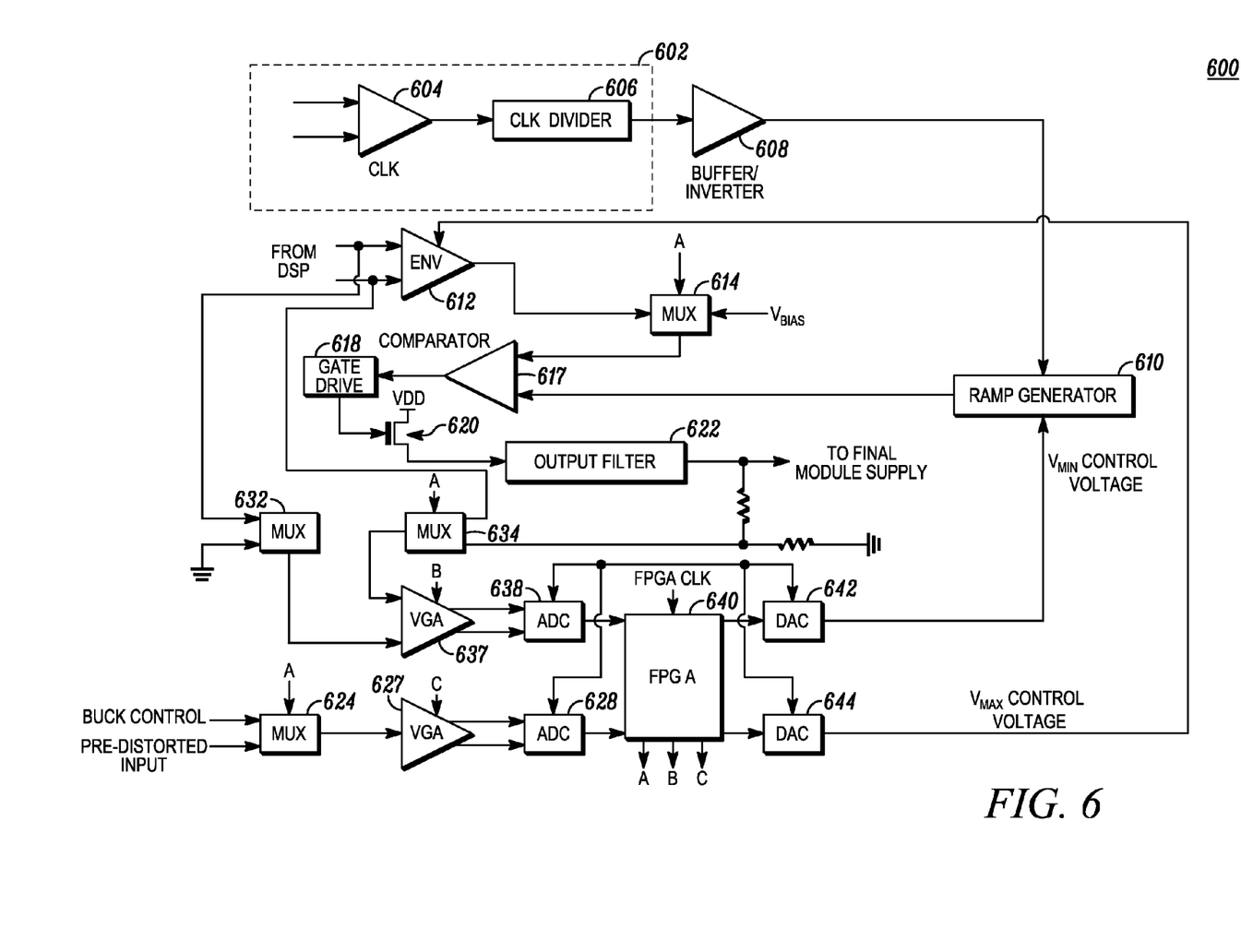
FIG. 6 illustrates a block diagram of another embodiment of architecture in the PA module of FIG. 4.

FIG. 6 illustrates a slightly different architecture 600 than that of FIG. 5. Unlike in FIG. 5, the FPGA 640 in FIG. 6 employs a control signal to vary the amplitude of the envelope reference waveform at the ENV converter 612. In this case, as the ENV control voltage increases, the maximum power supply voltage increases commensurately and as the ENV control voltage decreases, the maximum power supply voltage decreases commensurately. Although not expressly described below, variations similar to those in FIG. 5 can also be employed in the architecture of FIG. 6.

In the embodiment of FIG. 6, clock (CLK) and envelope (ENV) signals are provided from the Transmitter Module. The clock module 602 contains a CLK differential-to-single ended amplifier 604 and a CLK divider 606 that reduces the clock rate of the clock signals from the CLK differential-to-single ended amplifier 604. The CLK signal is supplied to a Buffer 608 whose power supply voltage is constant. The output signal of the Buffer 608 is supplied to one input of a ramp generator 610.

The signal from the ENV converter 612 is supplied to an analog multiplexer (MUX) 614 along with a preset voltage Vbias. A control signal A is used to select either the ENV signal or the preset voltage. The signal selected from the multiplexer 614 as well as with the signal from the ramp generator 610 are supplied to a comparator 616. The output from the comparator 616 is amplified by a gate driver circuit 618 and then switched through a transistor 620. The output from the transistor 620 is then filtered by an output filter 622 before being provided to the power supply of the RFPA 450 shown in FIG. 4.

The differential ENV signal is also supplied to separate multiplexers 632, 634, each of which are controlled by the same control signal A as multiplexer 614. The other selectable input of one of the multiplexers 632 is grounded while the other input selectable input of the other of the multiplexers 634 is tied to the output of the output filter 622 through a voltage divider circuit. The outputs of the multiplexers 632, 634 are supplied to a VGA 636, whose analog differential output is supplied to an ADC 638 that produces a single ended digital output.

Another multiplexer 624, controlled by the same control signal as multiplexers 614, 632 and 634, selects between a buck control signal and the pre-distorted signal from the input coupler 448 in FIG. 4. Similar to the above, the output from multiplexer 624 is supplied to a VGA 626, whose analog differential output is supplied to an ADC 628 that produces a single ended digital output. The gains of the VGAs 626, 636 are individually controlled by different control signals B, C, which permits full usage of the output range of the ADCs 628, 638. The outputs of the ADCs 628, 638 are supplied to the FPGA 640, which employs the algorithm described herein to determine the minimum and maximum power supply voltages. The FPGA 640 also provides the control signals A, B, C to the multiplexers 614, 624, 632, 634 and VGAs 626, 636. The digital minimum and maximum power supply voltages from the FPGA 640 are supplied to DACs 642, 644. The analog output from DAC 642, which indicates the minimum power supply voltage, is supplied to the input of the ramp generator 610 (e.g., the positive input of an op amp used in the ramp generator 610). Similarly, the output from DAC 644, which indicates the maximum power supply voltage, is supplied to the ENV converter 612 to control its amplification.

As in FIG. 5, the use of the multiplexers 614, 624, 632, 634 permits the PA module to switch between the envelope mode and buck emulation mode and control the gain of VGAs 626, 636.

In another embodiment, the power supply modulation may be provided using an interleaved approach. In this embodiment, the clock divider generates multiple out-of-phase (e.g., equally spaced) clock signals. Each of these clock signals is provided to a different Buffer, ramp generator, comparator circuit, gate drive, and transistor. The signals are then combined at the output filter. For example, the clock divider may generate four clock signals that are 90 degrees out-of-phase with each other, each of which is sent to a different one of four Buffers, four ramp generators, four comparator circuits, four gate drivers, and four transistors. The Vmax control voltage and Vmin Control voltage signals to the four ramp generator circuits and/or ENV signals to the ENV converter are identical. The use of interleaving reduces speed of the gate drive so that a slower clock can be used, thereby reducing the thermal load and power dissipation of the gate and transistor as well as permitting filtering of spurs at the switching frequency that may coincide with the signal frequency. The use of interleaving however, may increases the size and cost due to the use of multiple similar components.

In another embodiment (not shown), both the amplification provided by the ENV converter and the Buffer power supply can be varied.

Figure 7:
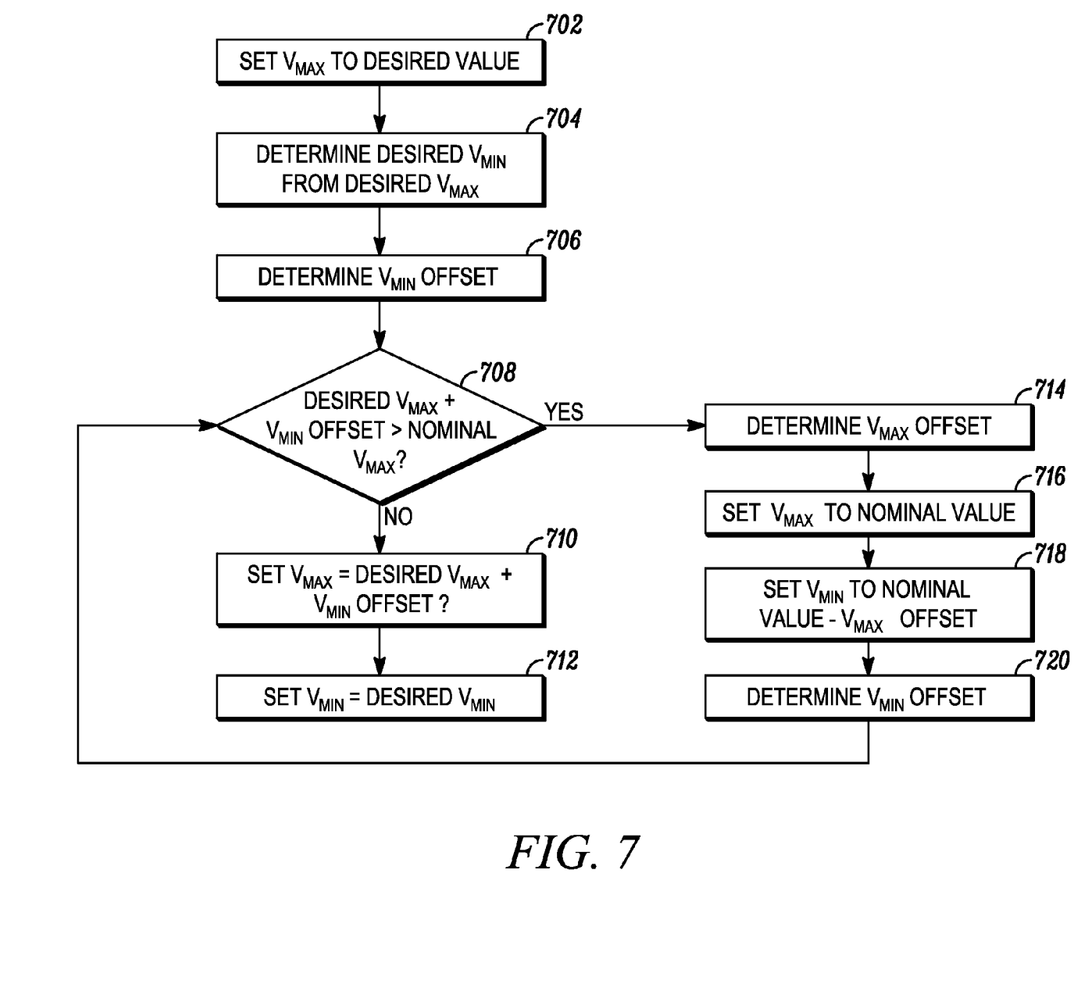
FIG. 7 illustrates one embodiment of a method of power supply modulation in the communication device.

A flowchart of one embodiment of the method of adjusting the minimum and maximum power supply voltage is shown in FIG. 7. Several terms are used herein and are defined as follows: Vmax_nomimal is the maximum allowable modulated power supply voltage (also referred to as the nominal maximum power supply voltage), Vmin_nomimal is the maximum allowable minimum modulated power supply voltage (also referred to as the nominal minimal power supply voltage), Vmax_desired is the desired maximum modulated power supply voltage (also referred to as the optimal maximum voltage of the modulated supply), Vmin_desired is the desired minimum modulated power supply voltage (also referred to as the optimal minimum voltage of the modulated supply), Vmax_offset is Vmax_nominal−Vmax_desired and Vmin_offset is a variable that depends on the state in the algorithm. The appropriate minimum and maximum power supply voltages are provided to the supply modulator after each iteration. Thus, it may take a short amount of time for the minimum and maximum power supply voltages to settle to their desired values. However, this settling time is relatively short compared to the changes in the envelope signal (a baseband signal with a bandwidth of less than about 100 KHz). For example, the envelope signal may be sampled at a rate of several MHz—10-20 times higher than that of the envelop signal itself.

As shown, the maximum power supply voltage is initially set to Vmax_desired (i.e., the optimal maximum modulated voltage for the RFPA to be maintained near saturation) at step 702. Vmin_desired is then determined at step 704 based on Vmax_desired using the stored information in the FPGA (in the lookup table or polynomial). The amount of offset of the minimum power supply voltage from the nominal power supply voltage is then determined at step 706 such that Vmin_offset=Vmin_nomimal−Vmin_desired.

After determining the minimum offset at step 706, it is then determined at step 708 whether Vmax_desired+Vmin_offset>Vmax_nomimal. This is used because the maximum power supply voltage correspondingly decreases with a decrease in the minimum power supply voltage. Accordingly, if the maximum desired power supply voltage is to be maintained, then the maximum power supply voltage is to be increased by the amount that the minimum power supply voltage is reduced. However, as the maximum power supply voltage cannot exceed the nominal maximum power supply voltage, the process determines whether further adjustments are to be made. Thus, if it is determined at step 708 that Vmax_desired+Vmin_offset≦Vmax_nomimal, the maximum power supply voltage is set to Vmax_desired+

Vmin_offset at step 710 and the minimum power supply voltage is set to Vmin_desired at step 712.

If, on the other hand, it is determined at step 708 that Vmax_desired+Vmin_offset>Vmax_nomimal, then at step 714 Vmax_offset is determined such that Vmax_offset=Vmax_nominal−Vmax_desired. At step 716, the maximum power supply voltage is set to Vmax_nominal. At step 718, the minimum power supply voltage is set to Vmin_nomimal−Vmax_offset. Then, at step 720, Vmin_offset is reset to Vmin_offset−Vmax_offset before the process returns to step 708 to again determine whether Vmax_desired+Vmin_offset (from step 720)>Vmax_nomimal.

In one example, Vmax_nominal=28V, Vmin_nomimal=14V, Vmax_desired=26V, and Vmin_desired=13V (predetermined based on Vmax_desired). Thus at step 706, Vmin_offset=V_min_nominal−Vmin_desired=14V−13V=1V. At step 708, Vmax_desired+Vmin_offset=26V+1V=27V and is compared to Vmax_nominal of 28V. In this case, since step 708 is false (27V is not>28V), the maximum power supply voltage is set to Vmax_desired+Vmin_offset (i.e., 27V) at step 710 and the minimum power supply voltage is set to Vmin_desired (i.e., 13V) at step 712 and the process terminates (i.e., Vmax_desired is 26V and Vmin_desired is 13V).

In another example, Vmax_nominal=28V, Vmin_nomimal=14V, Vmax_desired=25V, and Vmin_desired=10V (again predetermined based on Vmax_desired). Thus, at step 706 Vmin_offset=V_min_nominal−Vmin_desired=14V−10V=4V. At step 708 Vmax_desired+Vmin_offset=25V+4V=29V and is compared to Vmax_nominal of 28V. In this case, since step 708 is true (29V is >28V), this is unacceptable as the maximum power supply voltage cannot exceed the nominal maximum power supply voltage. In other words, the maximum power supply voltage cannot increase by the amount the minimum power supply voltage is supposed to be decreased.

As step 708 is true (Vmax_desired+Vmin_offset>Vmax_nominal), the adjustment to achieve Vmax_desired and Vmin_desired is performed in stages. The first step is to determine Vmax_offset=Vmax_nominal−Vmax_desired=28V−25V=3V at step 714. The maximum voltage supply is then increased by 3V to Vmax_nomimal at step 716 and the minimum voltage supply is then decreased by 3V from 14V (Vmin_nominal) to 11V at step 718 (i.e., in setting the minimum voltage to 11V, the maximum voltage will thus be at 2 W as discussed above). Next it is determined how much more the minimum power supply voltage is to be shifted to get to Vmin_desired, while maintaining Vmax_desired. A new Vmin_offset is calculated as =the original Vmin_offset−Vmax_offset=4V−3V=1V at step 720. This new Vmin_offset is now used to determine whether Vmax_desired+Vmin_offset>Vmax_nominal (i.e., whether 25V+1V >28V) at step 708. In this case, now that this is no longer true, the maximum power supply voltage is now set to Vmax_desired+Vmin_offset=25V+1V=26V at step 710 while the minimum power supply voltage is set to Vmin_desired=10V at step 712. Having reached the desired minimum and maximum power supply voltages, the process again terminates (i.e., Vmax_desired is 25V and Vmin_desired is 10V).

In the above embodiments, the minimum and maximum power supply voltages are set in series, with the maximum power supply voltage being set first and then the minimum power supply being set later. This is advantageous in embodiments in which only one DAC is present after the FPGA. In another embodiment, the minimum and maximum power supply voltages may be set simultaneously. In this case, multiple DACs are present and may thus provide both voltages at the same time from the FPGA. This is shown in FIG. 5.

Figure 8:
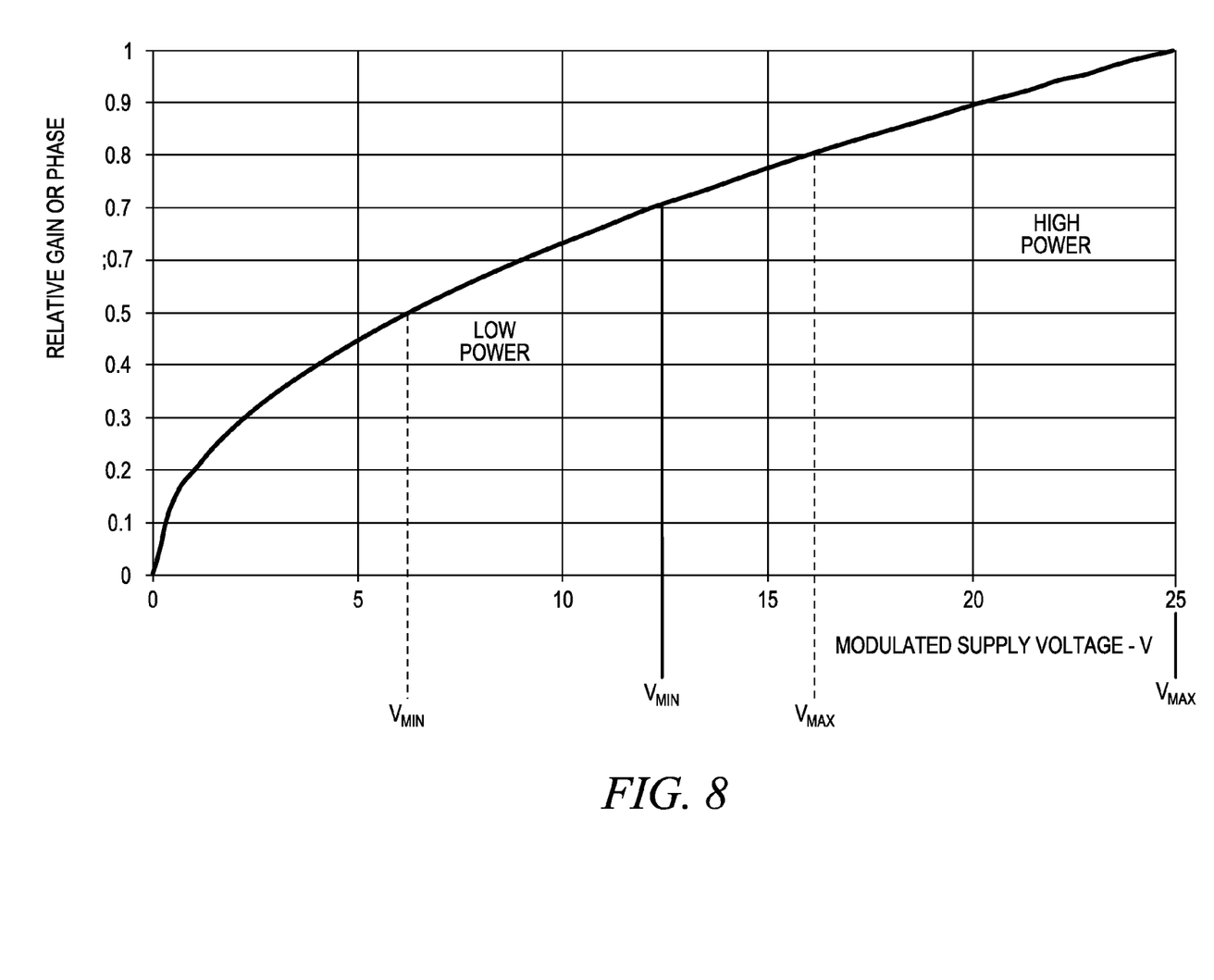
FIG. 8 illustrates one embodiment of a simulated graph of gain/phase change vs. modulated power supply voltage.

A simulated graph of gain/phase change vs. modulated power supply voltage is shown in FIG. 8. The high and low power Vmax/Vmin ratio is determined by the maximum allowable gain/phase change, thus providing for maximum efficiency of the power amplifier. This is true, in one embodiment, as long as the Vmax/Vmin optimal ratio does not require Vmin to fall below a fixed value (such as a predetermined level of half the main supply voltage). In this case, the maximum possible efficiency is not maintained, since Vmin is fixed.

In a different embodiment, Vmin is allowed to decrease such that the Vmax/Vmin ratio is optimal. In this case, the maximum efficiency of the power amplifier is able to be maintained even for low output power levels. This approach also allows for the Vmax desired level to be below the aforementioned predetermined level (e.g., half the main supply voltage), since Vmin is a function of the Vmax/Vmin ratio and not simply a voltage level.

In various embodiments, the power supply voltage may be adjusted when compression occurs in the RFPA. For example, the peak-to-average power ratio of the input signal to the RFPA may be compared to an ideal peak-to-average power ratio. The PA module automatically compensates for compression by increasing the RF input signal peaks by predetermined step sizes (that can be dynamically adjusted so that the step size changes), and thus the input peak-to-average power ratio. However in any given architecture the amount of compensation in a closed loop system may be limited, thus the power supply voltage levels may be adjusted in addition to any loop compensation. In this case, if the power supply voltage is to be increased to avoid signal compression, the minimum voltage level is able to be adjusted accordingly (i.e., using the algorithm described above).

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure and Summary section are provided to allow the reader to quickly ascertain the nature of the technical disclosure. It is submitted with the understanding that neither will be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Those skilled in the art will recognize that a wide variety of modifications, alterations, and combinations can be made with respect to the above described embodiments without departing from the spirit and scope of the invention and that such modifications, alterations, and combinations are to be viewed as being within the scope of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims issuing from this application. The invention is defined solely by any claims issuing from this application and all equivalents of those issued claims.

The invention claimed is:

1. A method for controlling a power supply voltage of a power amplifier in a power amplifier module, the method comprising the power amplifier module:
    receiving from a transmitter module an envelope of a signal;
    establishing a desired maximum power supply voltage for the power amplifier based on the envelope, the desired maximum power supply voltage smaller than a nominal maximum power supply voltage;
    determining a desired minimum power supply voltage for the power amplifier based on a desired maximum power supply voltage, the desired minimum power supply voltage smaller than a nominal minimum power supply voltage; and
    modulating the power supply voltage of the power amplifier using a modulated power supply voltage between the desired maximum power supply voltage and the desired minimum power supply voltage.

2. The method of claim 1, further comprising if a dynamic range of the power amplifier would be exceeded while setting the modulated power supply voltage between the desired maximum power supply voltage and the desired minimum power supply voltage, the power amplifier module adjusting the desired maximum power supply voltage and the desired minimum power supply voltage in steps such that the dynamic range of the power amplifier is not exceeded.

3. The method of claim 2, further comprising the power amplifier module:
    calculating a minimum offset voltage formed from a difference between the nominal minimum power supply voltage and the desired minimum power supply voltage;
    calculating whether the desired maximum power supply voltage added to the minimum offset voltage is greater than the nominal maximum power supply voltage;
    deciding to adjust the modulated power supply voltage in steps when the desired maximum power supply voltage added to the minimum offset voltage is greater than the nominal maximum power supply voltage; and
    deciding not to adjust the modulated power supply voltage in steps when the desired maximum power supply voltage added to the minimum offset voltage is not greater than the nominal maximum power supply voltage.

4. The method of claim 3, wherein if it is decided not to adjust the modulated power supply voltage in steps, the power amplifier module:
    increases the maximum power supply voltage to the desired maximum power supply voltage plus the minimum offset voltage; and
    reduces the minimum power supply voltage to the desired minimum power supply voltage thereby establishing the desired maximum power supply voltage.

5. The method of claim 3, wherein if it is decided to adjust the modulated power supply voltage in steps, the power amplifier module:
    calculates a maximum offset voltage formed from the difference between the nominal maximum power supply voltage and the desired maximum power supply voltage;
    increases the maximum power supply voltage to the desired maximum power supply voltage plus the maximum offset voltage;
    changes the minimum power supply voltage to the nominal minimum power supply voltage less the maximum offset voltage;
    resets the minimum offset voltage to the minimum offset voltage less the maximum offset voltage to form a reset minimum offset voltage;
    calculates whether the desired maximum power supply voltage added to the reset minimum offset voltage is greater than the nominal maximum power supply voltage; and
    decides to adjust the modulated power supply voltage in steps only when the desired maximum power supply voltage added to the reset minimum offset voltage is greater than the nominal maximum power supply voltage.

6. The method of claim 2, wherein adjusting the desired maximum and minimum power supply voltage in steps comprises:
    setting the maximum power supply voltage to an intermediate maximum voltage between the maximum power supply voltage and the desired maximum power supply voltage inclusive; and
    setting the minimum power supply voltage to an intermediate minimum voltage after setting the maximum power supply voltage to the intermediate voltage thereby adjusting the maximum power supply voltage to the intermediate maximum voltage less a difference between the minimum power supply voltage and the intermediate minimum voltage, the intermediate minimum voltage being between the minimum power supply voltage and the desired minimum power supply voltage inclusive.

7. The method of claim 1, wherein determining the desired minimum power supply voltage comprises retrieving the desired minimum power supply voltage from a lookup table using the desired maximum power supply voltage or calculating the desired minimum power supply voltage based on the desired maximum power supply voltage using a polynomial.

8. The method of claim 1, further comprising switching the power amplifier module between an envelope mode in which the power supply voltage is modulated using the envelope of the signal to be transmitted and a buck emulation mode in which the power supply voltage is not modulated or is modulated independent of the enveloped of the signal to be transmitted.

9. A transceiver comprising:
    a transmitter module containing a first processor configured to generate a signal to be transmitted and an envelope of the signal to be transmitted; and an amplifier module containing:
: a second processor configured to receive the envelope of the signal to be transmitted and detect an envelope of a signal to be amplified, determine a desired minimum power supply voltage from a desired maximum power supply voltage and provide a supply modulation signal based thereon, the desired minimum and desired maximum power supply voltage less than a nominal minimum and maximum power supply voltage, respectively;
: a supply modulator configured to receive the supply modulation signal and provide a power supply voltage whose value is between the desired minimum and desired maximum power supply voltage;
: a power amplifier configured to receive the power supply voltage and amplify the signal to be transmitted dependent on the power supply voltage.

10. The transceiver of claim 9, wherein the second processor determines whether a dynamic range of the power amplifier would be exceeded while setting the modulated power supply voltage between the desired maximum and minimum power supply voltages and if so adjusts the desired maximum and minimum power supply voltage in steps such that the dynamic range of the power amplifier is not exceeded.

11. The transceiver of claim 10, wherein in determining whether a dynamic range of the power amplifier would be exceeded while setting the modulated power supply voltage between the desired maximum and minimum power supply voltages the second processor:
: calculates a minimum offset voltage formed from the difference between the nominal minimum power supply voltage and the desired minimum power supply voltage;
: calculates whether the desired maximum power supply voltage added to the minimum offset voltage is greater than the nominal maximum power supply voltage; and
: decides to adjust the modulated power supply voltage in steps only when the desired maximum power supply voltage added to the minimum offset voltage is greater than the nominal maximum power supply voltage.

12. The transceiver of claim 11, wherein if the second processor decides not to adjust the modulated power supply voltage in steps, the second processor module:
: increases the maximum power supply voltage to the desired maximum power supply voltage added to the minimum offset voltage; and
: reduces the minimum power supply voltage to the desired minimum power supply voltage thereby establishing the desired maximum power supply voltage.

13. The transceiver of claim 11, wherein if the second processor decides to adjust the modulated power supply voltage in steps, the second processor:
: calculates a maximum offset voltage formed from the difference between the nominal maximum power supply voltage and the desired maximum power supply voltage;
: increases the maximum power supply voltage to the desired maximum power supply voltage plus the maximum offset voltage;
: changes the minimum power supply voltage to the nominal minimum power supply voltage less the maximum offset voltage;
: resets the minimum offset voltage to the minimum offset voltage less the maximum offset voltage to form a reset minimum offset voltage;
: calculates whether the desired maximum power supply voltage added to the reset minimum offset voltage is greater than the nominal maximum power supply voltage; and
: decides to adjust the modulated power supply voltage in steps only when the desired maximum power supply voltage added to the reset minimum offset voltage is greater than the nominal maximum power supply voltage.

14. The transceiver of claim 10, wherein in adjusting the desired maximum and minimum power supply voltage in steps, the second processor:
: sets the maximum power supply voltage to an intermediate maximum voltage between the maximum power supply voltage and the desired maximum power supply voltage inclusive; and
: sets the minimum power supply voltage to an intermediate minimum voltage after setting the maximum power supply voltage to the intermediate voltage thereby adjusting the maximum power supply voltage to the intermediate maximum voltage less a difference between the minimum power supply voltage and the intermediate minimum voltage, the intermediate minimum voltage being between the minimum power supply voltage and the desired minimum power supply voltage inclusive.

15. The transceiver of claim 9, wherein the power amplifier module comprises a memory that stores at least one of a lookup table or polynomial, the at least one of the lookup table or polynomial retrieved by the second processor to determine the desired minimum power supply voltage based on the desired maximum power supply voltage.

16. The transceiver of claim 9, wherein the power amplifier module comprises multiplexers controlled by control signals from the second processor to switch the power amplifier module between an envelope mode in which the power supply voltage is modulated using the envelope of the signal to be transmitted and a buck emulation mode in which the power supply voltage is not modulated or is modulated independent of the envelope of the signal to be transmitted with a constant voltage.

17. The transceiver of claim 9, wherein the power amplifier module further comprises:
: a buffer having a clock input provided with a clock signal, a buffer power supply input provided with a buffer power supply, and an output providing a buffer output;
: an envelope converter having an input supplied with the envelope of the signal to be transmitted, an envelope converter control input provided with an envelope converter control signal, and an output providing an envelope output;
: a ramp generator having inputs supplied with the buffer output and a ramp input signal and having an output providing a ramp output; and
: a comparator configured to compare the envelope output with the ramp output.

18. The transceiver of claim 17, wherein:
: the buffer power supply input is adjusted based on the desired maximum power supply voltage and controls a magnitude of the ramp output, and
: the ramp input signal is adjusted based on the desired minimum power supply voltage and controls an offset of the ramp output.

19. The transceiver of claim 17, wherein:
: the envelope converter control input is adjusted based on the desired maximum power supply voltage and controls a magnitude of the envelope converter output, and
: the ramp input signal is adjusted based on the desired minimum power supply voltage and controls an offset of the ramp output.

20. A radio comprising:

a power amplifier;

a power supply modulator configured to modulate a power supply voltage of the power amplifier;

a memory containing information leading to determination of a desired minimum power supply voltage of the power amplifier when provided with a desired maximum power supply voltage of the power amplifier, the information tailored for the radio and taking into account environmental changes; and a processor configured to provide the desired maximum power supply voltage to the memory and retrieve the desired minimum power supply voltage, the processor having the desired maximum and minimum power supply voltages further configured to provide control signals to the power supply modulator to modulate the power supply voltage between the desired maximum and minimum power supply voltages without exceeding a dynamic range of the power amplifier.

* * * * *